United States Patent [19]
Wachter et al.

[11] Patent Number: 5,744,878
[45] Date of Patent: Apr. 28, 1998

[54] CIRCUIT CONFIGURATION FOR TRIGGERING A FIELD EFFECT TRANSISTOR WITH A SOURCE-SIDE LOAD

[75] Inventors: Franz Wachter, Villach; Heinz Zitta, Drobollach; Johann Massoner, Villach, all of Australia

[73] Assignee: Siemens Aktiengesellschaft, Munich, Germany

[21] Appl. No.: 814,634

[22] Filed: Mar. 10, 1997

[30] Foreign Application Priority Data

Mar. 8, 1996 [DE] Germany .................. 196 09 121.7

[51] Int. Cl.[6] .................................................. H03K 17/687
[52] U.S. Cl. ........................ 307/130; 307/112; 327/111; 327/374
[58] Field of Search .................................... 307/112, 125, 307/130, 139, 140; 327/581, 365, 390, 589, 427, 108, 111, 374–377

[56] References Cited

U.S. PATENT DOCUMENTS 4,736,121  4/1988  Cini et al. ............................. 327/376
5,371,418 12/1994  Leipold et al. ....................... 327/108

*Primary Examiner*—Richard T. Elms
*Attorney, Agent, or Firm*—Herbert L. Lerner; Laurence A. Greenberg

[57] ABSTRACT

A circuit configuration for triggering a field effect transistor with a source-side load has a capacitor which is connected on one hand through a load path of the field effect transistor to a supply voltage and on the other hand both to a first charging device and to a first controllable switching device. The first switching device is connected between the capacitor and a gate terminal of the field effect transistor. A second charging device acts through a second controllable switching device to charge a gate-to-source capacitor of the field effect transistor. A comparator monitors a voltage at the gate terminal of the field effect transistor and makes the first switching device conducting when a predetermined value is reached.

7 Claims, 2 Drawing Sheets

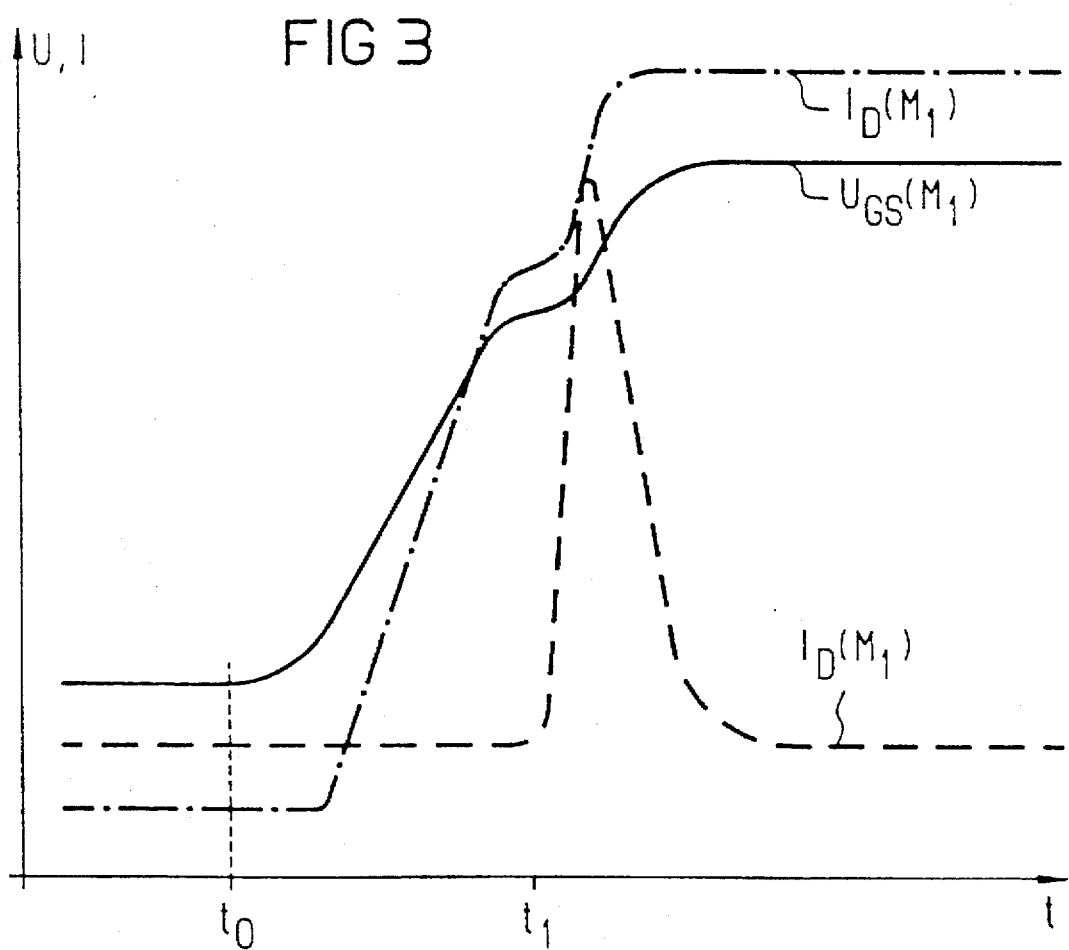

CIRCUIT CONFIGURATION FOR TRIGGERING A FIELD EFFECT TRANSISTOR WITH A SOURCE-SIDE LOAD

BACKGROUND OF THE INVENTION

Field of the Invention

The invention relates to a circuit configuration for triggering a field effect transistor having a load path through which a load on the source side is acted upon with a supply voltage, including a capacitor connected to both a charging device and a controllable switching device, the switching device connecting one terminal of the capacitor to a gate terminal of the field effect transistor.

One such circuit configuration is known, for instance, from Published European Patent Application 0 405 407 A2. In such a field effect transistor constructed as a switch, the drain terminal is applied to the positive operating voltage. Since only n-channel field effect transistors can be used as driver transistors, upon turn-on an artificial elevation of the gate voltage through the drain voltage is necessary, so that the transistor will enter the low-loss $R_{on}$ range. The applicable formula is $U_{DS} < U_{GS} - U_T$. In such configurations, relatively high switching speeds and the simplest possible circuit with low surface-area expense are also demanded.

In order to achieve an increased voltage, so-called charge pumps are known, in which the elevated operating voltage is in principle attained through the use of a switchover of a plurality of capacitors from parallel (charging phase) to serial (charge reversal or discharging phase). However, that kind of charge pump circuit is complicated and expensive and requires a relatively large surface area in integration. For that reason, the so-called bootstrap principle is often used for such applications, but it only functions dynamically.

Published European Patent Application 0 405 407 A1 shows that kind of bootstrap circuit. A capacitor is initially charged to the operating voltage through a supply voltage terminal and a diode, and at the instant of turn-on it is applied through a switch to the gate of a field effect transistor. The drain current then begins to flow, and the gate is "pumped up" by the voltage drop at the load resistor. The power transistor thus reaches the linear operating range.

In order to enable a calculation of the charge compensation and the gate voltage that comes to be established as stationary, it is assumed that the voltage at the capacitor is equal to the supply voltage. The following equation then applies:

$$C_{GS} = \frac{U_{DD} + \frac{C_{GS}}{C_H} U_{GSO}}{1 + \frac{C_{GS}}{C_H}} \quad (1)$$

If one assumes that in the OFF state the voltage at the gate-to-source capacitor is equal to zero, then for the gate-to-source voltage $U_{GS}$ in the steady-state, that is when the switch is closed, the resultant equation as a function of the gate-to-source capacitance $C_{GS}$ and the capacitance C is as follows:

$$U_{GS} = \frac{U_{DD}}{1 + \frac{C_{GS}}{C_H}} \quad (2)$$

This voltage is sufficient if large auxiliary capacitors can be used in discrete circuits, or if $C > C_{GS}$. Since the gate-to-source capacitance of integrated power transistors is generally very high, that principle can hardly be realized at reasonable surface-area expenditure.

SUMMARY OF THE INVENTION

It is accordingly an object of the invention to provide a circuit configuration for triggering a field effect transistor with a source-side load, which overcomes the hereinafore-mentioned disadvantages of the heretofore-known devices of this general type.

With the foregoing and other objects in view there is provided, in accordance with the invention, a circuit configuration for triggering a field effect transistor having a gate terminal, a gate-to-source capacitor, a source side load and a load path through which the load is acted upon by a supply voltage, the circuit configuration comprising a first charging device; a capacitor connected to the first charging device, the capacitor having terminals; a first controllable switching device connected between a first terminal of the capacitor and the gate terminal of the field effect transistor; a second charging device; a second controllable switching device through which the second charging device charges the gate-to-source capacitor of the field effect transistor; and a comparator monitoring a voltage at the gate terminal of the field effect transistor and conductively triggering the first switching device when a predetermined value is attained.

It can be seen from equation (1) that in order to minimize the surface-area expenditure, the term $U_{GSO} C_{GS} C_H$ should be utilized. That is, prior to the actual charge compensation, the gate-to-source capacitor should have the highest possible initial charge $Q_{GSO} > 0$. That demand is met according to the invention by the additional charging device. If the voltage at the gate of the field effect transistor has attained a predetermined value, the switch can be activated, and the charge compensation can be effected between the bootstrap capacitor and the gate-to-source capacitor.

In accordance with another feature of the invention, the additional charging device is constructed as a controllable current source and a series-connected diode.

In accordance with a further feature of the invention, in order for the gate-to-source capacitor to be fully discharged prior to the turn-on operation, a second controllable current source is provided in addition and is triggered with the inverted trigger signal, so that in the OFF state the gate-to-source capacitor is discharged.

In accordance with an added feature of the invention, the comparator is particularly advantageously and simply realized through the use of a voltage-current converter with a current mirror coupled thereto.

In accordance with an additional feature of the invention, in order to attain a higher switching speed, a third switching device is used to impose the supply voltage on the second terminal of the bootstrap capacitor. A further advantage of such an embodiment is that the voltage jump occurs at a defined time. The third switching device is preferably triggered by the output signal of the current mirror of the comparator.

In accordance with yet another feature of the invention, there is provided a third controllable current source connected to the second terminal of the bootstrap capacitor for applying the capacitor to a defined reference level before the field effect transistor is turned on.

In accordance with a concomitant feature of the invention, there is provided a small charge pump that is not turned on until later for preventing the gates of the power transistors from discharging through residual diode currents. Static operation can also be assured through the use of this simple feature of the circuit of the invention.

Other features which are considered as characteristic for the invention are set forth in the appended claims.

Although the invention is illustrated and described herein as embodied in a circuit configuration for triggering a field effect transistor with a source-side load, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a graph showing a signal course of certain voltages and currents of the circuit configuration of FIG. 2.

DESCRIPTION OF THE PREFERRED EMBODIMENTS

Figure 1:
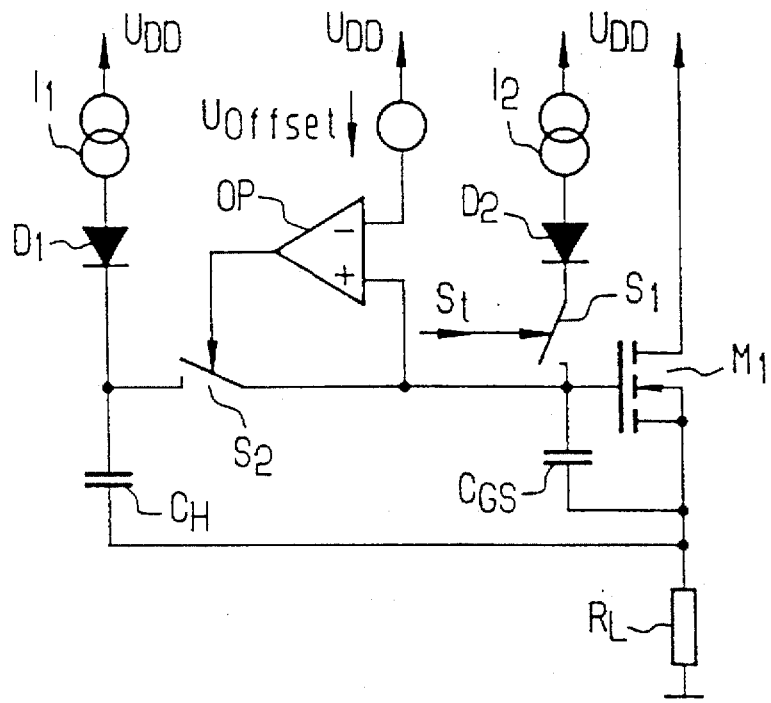
FIG. 1 is a basic schematic diagram of a charge regulation circuit.

Referring now to the figures of the drawings in detail and first, particularly, to FIG. 1 thereof, there is seen a field effect transistor indicated by reference symbol $M_1$, having a drain terminal on which a supply voltage $U_{DD}$ is imposed and a source terminal that is connected through a resistor $R_L$ to ground. Reference symbol $C_{GS}$ designates a gate-to-source capacitor of the power MOSFET $M_1$. A series circuit including a second controllable switch $S_1$, a diode $D_2$ and a current source $I_2$ is connected between the transistor $M_1$ and the supply voltage terminal $U_{DD}$. A second charging device is formed by the current source $I_2$ and the diode $D_2$. The controllable switch $S_1$ is triggered by a control signal $S_t$. A gate terminal of the transistor $M_1$ is also connected through a first controllable switch S2 to a first terminal of a capacitor $C_H$. A second terminal of the capacitor $C_H$ is connected to the source terminal of the transistor $M_1$. A further series circuit including a current source $I_1$ and a diode $D_1$ is connected between the supply voltage terminal $U_{DD}$ and the first terminal of the capacitor $C_H$. A first charging device is formed by the current source $I^1$ and the diode $D_1$. The controllable switch $S_2$ is triggered by an output signal of an operational amplifier OP connected as a comparator. An inverting input of the operational amplifier OP is connected through an auxiliary voltage source $U_{offset}$ to the supply voltage terminal $U_{DD}$. A noninverting input of the operational amplifier OP is connected to the gate terminal of the transistor $M_1$.

If the switch $S_1$ is closed by a suitable control signal, the current source $I_2$ is activated, and the gate-to-source capacitor $C_{GS}$ charges through the load resistor $R_L$. Since the transistor $M_1$ is not operating in the saturation range and its drain current causes a voltage drop at the load resistor $R_L$, a maximum initial gate-to-source voltage $U_{GS0}$ is lower in amount than the operating voltage $U_{DD}$. In the case of the stable state after the addition of the current source $I_2$, where $I(C_{GS})=0$ and where the applicable transistor characteristic curve is in the saturation range, $$I_D = I_{RL} = \frac{\beta}{2} (U_{GS} - U_{Tn})^2 \qquad (3)$$

and $$U_{DD} = U_{GS0} + \frac{\beta R_L}{2} (U_{GS0} - U_{Tn})^2. \qquad (4)$$

the solution being $$U_{GS0_{1,2}} = U_{Tn} - \frac{1}{\beta R_L} \pm \frac{1}{\beta R_L} \sqrt{1 + 2\beta R_L(U_{DD} - U_{Tn})} \quad . \qquad (5)$$

Since for a finite drain current, necessarily $U_{GS0} \geq U_{Tn}$, this equation is reduced to $$U_{GS0} = U_{Tn} - \frac{1}{\beta R_L} (\sqrt{1 + 2\beta R_L(U_{DD} - U_{Tn})} - 1) \qquad (6)$$

In that equation, $R_L$ is the load resistor, $\beta$ is a gain factor, and $U_{Tn}$ is the threshold voltage of the MOS transistor $M_1$.

It is not until the above-described precharging can be considered to be concluded and the gate potential is approximately equal to the operating voltage $U_{DD}$, that the charge compensation is initiated, by the operational amplifier OP acting as a comparator. To that end, it is necessary to furnish a defined comparator switching point. For that purpose, a reference voltage is generated through the auxiliary voltage source $U_{offset}$, and the reference voltage is somewhat smaller than the supply voltage by subtraction from the supply voltage $U_{DD}$. Thus, after closure of the switch $S_2$, the gate-to-source voltage is established as $$U_{GS} = \frac{U_{DD} + \frac{C_{GS}}{C_H} U_{GS0}}{1 + \frac{C_{GS}}{C_H}} . \qquad (7)$$

Figure 2:
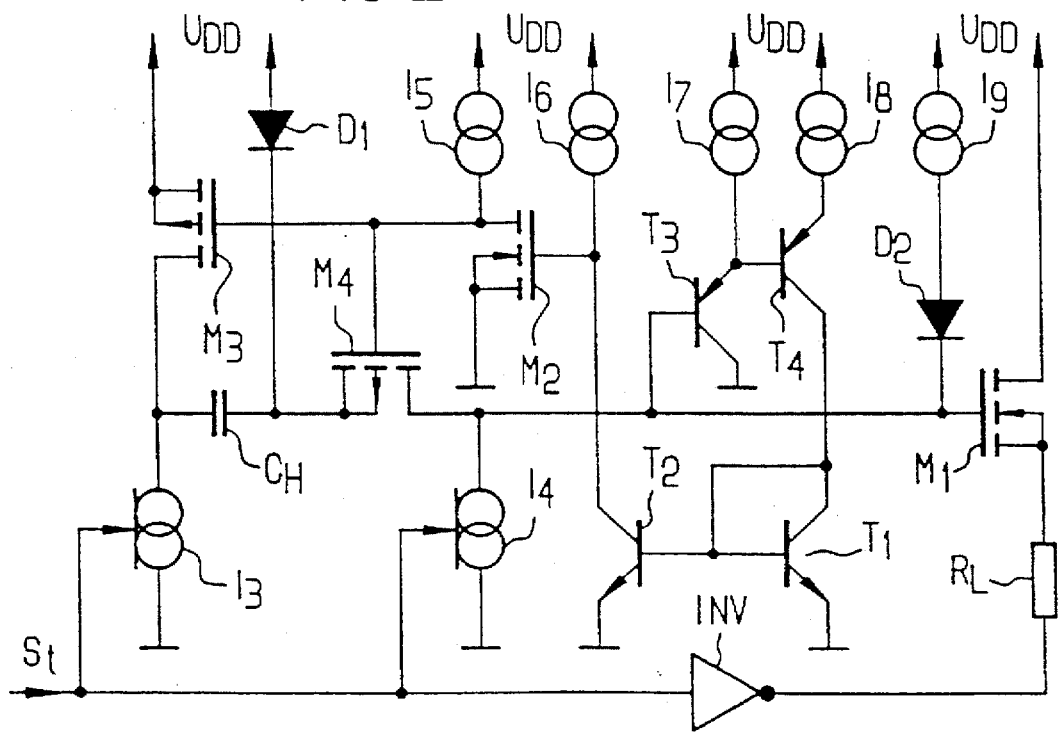
FIG. 2 is a schematic circuit diagram of an exemplary embodiment of a circuit configuration of the invention shown in FIG. 1.

FIG. 2 shows one exemplary embodiment of such a configuration according to the invention in further detail. Identical elements have the same reference numerals. A controllable current source $I_9$ is used in this case instead of the switch $S_1$. The controllable current source $I_9$ is triggered by an output signal of an inverter INV having an input on which the control signal $S_t$ is imposed. The switch $S_2$ in this case is constructed as a MOSFET transistor $M_4$. In this case the second terminal of the capacitor $C_H$ is connected on one hand through the load path of a further MOSFET $M_3$ to the supply voltage terminal $U_{DD}$, and on the other hand through a further controllable current source $I_3$ to ground. The MOSFET $M_3$ is a third switching device. The controllable current source $I_3$ is triggered by the control signal $S_t$. A further controllable current source $I_4$ which is connected between the gate terminal of the MOSFET $M_1$ and ground, is also triggered by the control signal $S_t$. The comparator is formed by bipolar transistors $T_1$–$T_4$, current sources $I_5$–$I_8$ and an output MOSFET $M_2$. A voltage-current converter includes the current source $I_7$ and the transistor $T_3$. A base terminal of the pnp transistor $T_3$ is connected to a gate terminal of the transistor $M_1$. A collector of the transistor $T_3$ is connected to ground, and an emitter thereof is connected both to a base of the pnp transistor T4 and through the current source $I_7$ to the supply voltage terminal $U_{DD}$. An emitter of the transistor $T_4$ is connected through the current source $I_4$ to the supply voltage terminal $U_{DD}$. A collector of the transistor $T_4$ is connected to a base and a collector of the npn transistor $T_1$. An emitter of the npn transistor $T_1$ is connected to ground. A base of the transistor $T_1$ is connected to a base of the npn transistor $T_2$. An emitter of the transistor $T_2$ is likewise connected to ground. A collector of the transistor $T_2$ is connected to both a gate terminal of the transistor $M_2$ and through the current source $I_6$ to the supply voltage terminal $U_{DD}$. A source terminal of the transistor $M_2$ is connected to ground, and a drain terminal thereof forms an output of the comparator. The drain terminal of the transistor $M_2$ is likewise connected through the current source $I_5$ to the supply voltage terminal $U_{DD}$. The drain terminal of the transistor $M_2$ is also connected to the gate terminals of transistors $M_3$ and $M_4$.

If the control signal $S_t$ is logical "1", then the gate of the transistor $M_1$ is discharged by the current source $I_4$, and the driver is switched off. At the same time, charging of the capacitor $C_H$ is effected through the use of the current source $I_3$ through the diode $D_1$. In this state, both the transistor $M_3$ and the transistor $M_4$ are blocked.

The activation of this trigger circuit is then effected through the use of a logical "0" of the control signal $S_t$. As a result, the current sources $I_3$ and $I_4$ are turned off, and the gate-to-source capacitor (which is not shown in FIG. 2) of the output transistor $M_1$ is charged through the load resistor $R_L$, the current source $I_9$ and the diode $D_2$, and the gate potential $U_G$ rises. The output transistor $M_1$ is in the saturation range, and its drain current increases.

If the gate potential $U_G$ is approximately two base-to-emitter voltages under the positive operating voltage $U_{DD}$, the collector currents of the transistors $T_3$ and $T_4$ break down, and therefore the gate of the transistor $M_2$ can no longer be drawn downward by the current mirror that is formed by the transistors $T_1$, $T_2$. The transistor $M_2$ thereupon opens and discharges the gates of the transistors $M_3$ and $M_4$. With the transistor $M_3$, the capacitor $C_H$, which is precharged to approximately the operating voltage, is applied with the correct sign to the operating voltage $U_{DD}$. The resultant overelevation of voltage effects a charge compensation through the transistor M4 to the gate-to-source capacitor of the transistor $M_1$. The gate-to-source potential $U_{GS}(M_1)$ rises, and the power transistor enters the linear operating range.

Conversely to the basic illustration of FIG. 1, in which the voltage rise at the load resistor is utilized, in this circuit the voltage jump is generated by turning on the transistor $M_3$. Besides the higher switching speed, this has the advantage of occurring at a defined time and thus not being able to cause premature opening of the transistor $M_4$ through the source control.

FIG. 3 shows the compensation current, that is the drain current of the transistor $M_4$, the gate voltage of the power transistor $M_1$ and the load current, that is the drain current of the transistor $M_1$, over time during the turn-on process. The transistor $M_1$ includes 600 parallel-connected cells, for instance. At the operating voltage, for instance of $U_{DD}$=12 V, $C_H$=20 pF and a load resistance, for instance, of $R_L$=100 Ω, the driver circuit is turned on at a time $t_0$. At a time $t_1$, that is about 3 µs later, the transistor $M_4$ is activated, and the charge pulse which is released causes an increase in the gate voltage by $\Delta U_G$, that is equal to approximately 4 V.

In principle, the circuit of the invention only functions dynamically. If a static turn-on is needed, then a small charge pump that is only turned on later can prevent the gates of the power transistors from discharging through residual diode currents.

We claim:

1. In a circuit configuration for triggering a field effect transistor having a gate terminal, a gate-to-source capacitor, a source side load and a load path through which the load is acted upon by a supply voltage, the improvement comprising:

a first charging device;

a capacitor connected to said first charging device, said capacitor having terminals;

a first controllable switching device connected between one terminal of said capacitor and the gate terminal of the field effect transistor;

a second charging device;

a second controllable switching device through which said second charging device charges the gate-to-source capacitor of the field effect transistor; and a comparator monitoring a voltage at the gate terminal of the field effect transistor and conductively triggering said first switching device when a predetermined value is attained.

2. The circuit configuration according to claim 1, wherein said second charging device and said second controllable switching device are formed by a series circuit of a controllable current source and a diode connected in the conducting direction.

3. The circuit configuration according to claim 2, including another controllable current source connected between the gate terminal of the field effect transistor and ground, said other controllable current source being triggered with a control signal being inverted relative to said second charging device.

4. The circuit configuration according to claim 1, wherein said comparator includes a voltage-current converter and a current mirror circuit coupled to said converter.

5. The circuit configuration according to claim 1, including a third switching device connecting another terminal of said capacitor to the supply voltage, said third switching device being switched as a function of an output signal of said comparator.

6. The circuit configuration according to claim 5, including a further controllable current source connected between another terminal of said capacitor and ground, said further controllable current source being triggered by a control signal inverted relative to said second charging device, and a diode connected between the one terminal of said capacitor and the supply voltage, said diode and said further controllable current source forming said first charging device.

7. The circuit configuration according to claim 1, including a charge pump having an output voltage connected to the one terminal of said capacitor.

* * * * *